United States Patent
Okazaki et al.

(10) Patent No.: US 6,636,085 B2
(45) Date of Patent: Oct. 21, 2003

(54) PHASE SHIFTER WITH AN RC POLYPHASE FILTER

(75) Inventors: Yukio Okazaki, Kanagawa (JP); Hisaya Ishihara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/125,826

(22) Filed: Apr. 19, 2002

(65) Prior Publication Data

US 2003/0001648 A1 Jan. 2, 2003

(30) Foreign Application Priority Data

Apr. 20, 2001 (JP) ......................................... 2001-123052

(51) Int. Cl.[7] .............................................. H03C 3/00
(52) U.S. Cl. ...................................... 327/101; 327/103
(58) Field of Search ................................ 327/101, 103, 327/233, 235, 238, 251, 254, 255, 257, 258, 259, 239, 242, 245, 344, 311, 522; 331/45

(56) References Cited

U.S. PATENT DOCUMENTS 5,572,162 A * 11/1996 Cotreau ....................... 327/552
6,084,472 A * 7/2000 Gilbert ........................ 330/254
6,236,847 B1 * 5/2001 Stikvoort .................... 455/313

FOREIGN PATENT DOCUMENTS

JP        06061784    *  4/1994    .......... H03H/11/04
JP       2001-045080  *  2/2001    .......... H04L/27/22

* cited by examiner

Primary Examiner—Timothy P. Callahan
Assistant Examiner—Linh Nguyen
(74) Attorney, Agent, or Firm—Scully, Scott, Murphy & Presser (57) ABSTRACT

There is disclosed a phase shifter using a polyphase filter, which achieves a broad band, suppresses errors in both amplitude and phase, and achieves low power consumption. A driving section includes a voltage-to-current conversion circuit for converting a voltage value of an input signal Si into a current value, and outputting an input current signal Ci. An RC polyphase filter 2 outputs a corresponding polyphase phase-shifted current signal Co according to supplying of the input current signal Ci. A load circuit 3 includes a polyphase current-to-voltage conversion circuit for converting a current value of the polyphase phase-shifted current signal Co into a voltage value, and outputting an output signal Vo.

5 Claims, 10 Drawing Sheets

$$Y_{11} = \begin{pmatrix} \dfrac{jc^2r\omega^2}{2(cr\omega-j)} + \dfrac{2c\omega}{cr\omega-j} - \dfrac{j}{2r(cr\omega-j)} & -\dfrac{c\omega}{2(cr\omega-j)} & 0 & -\dfrac{c\omega}{2(cr\omega-j)} \\ -\dfrac{c\omega}{2(cr\omega-j)} & \dfrac{jc^2r\omega^2}{2(cr\omega-j)} + \dfrac{2c\omega}{cr\omega-j} - \dfrac{j}{2r(cr\omega-j)} & -\dfrac{c\omega}{2(cr\omega-j)} & 0 \\ 0 & -\dfrac{c\omega}{2(cr\omega-j)} & \dfrac{jc^2r\omega^2}{2(cr\omega-j)} + \dfrac{2c\omega}{cr\omega-j} - \dfrac{j}{2r(cr\omega-j)} & -\dfrac{c\omega}{2(cr\omega-j)} \\ -\dfrac{c\omega}{2(cr\omega-j)} & 0 & -\dfrac{c\omega}{2(cr\omega-j)} & \dfrac{jc^2r\omega^2}{2(cr\omega-j)} + \dfrac{2c\omega}{cr\omega-j} - \dfrac{j}{2r(cr\omega-j)} \end{pmatrix}$$

$$Y_{12} = \begin{pmatrix} \dfrac{j}{2r(cr\omega-j)} & -\dfrac{jc^2r\omega^2}{2(cr\omega-j)} & 0 & -\dfrac{c\omega}{cr\omega-j} \\ -\dfrac{c\omega}{cr\omega-j} & \dfrac{j}{2r(cr\omega-j)} & -\dfrac{jc^2r\omega^2}{2(cr\omega-j)} & 0 \\ 0 & -\dfrac{c\omega}{cr\omega-j} & \dfrac{j}{2r(cr\omega-j)} & -\dfrac{jc^2r\omega^2}{2(cr\omega-j)} \\ -\dfrac{jc^2r\omega^2}{2(cr\omega-j)} & 0 & -\dfrac{c\omega}{cr\omega-j} & \dfrac{j}{2r(cr\omega-j)} \end{pmatrix}$$

FIG.5

$$Y_{21} = \begin{pmatrix} \frac{1}{2r(cr\omega-j)} & \frac{c\omega}{cr\omega-j} - \frac{1}{2r(cr\omega-j)} & \frac{jc^2r\omega^2}{2(cr\omega-j)} & 0 \\ 0 & \frac{jc^2r\omega^2}{2(cr\omega-j)} & \frac{c\omega}{cr\omega-j} - \frac{1}{2r(cr\omega-j)} & \frac{jc^2r\omega^2}{2(cr\omega-j)} \\ \frac{jc^2r\omega^2}{2(cr\omega-j)} & \frac{c\omega}{cr\omega-j} & -\frac{1}{2r(cr\omega-j)} & 0 \\ \frac{c\omega}{cr\omega-j} & -\frac{1}{2r(cr\omega-j)} & 0 & \frac{jc^2r\omega^2}{2(cr\omega-j)} \\ 0 & \frac{jc^2r\omega^2}{2(cr\omega-j)} & \frac{c\omega}{cr\omega-j} & -\frac{1}{2r(cr\omega-j)} \end{pmatrix}$$

$$Y_{22} = \begin{pmatrix} \frac{jc^2r\omega^2}{2(cr\omega-j)} - \frac{2c\omega}{cr\omega-j} + \frac{j}{2r(cr\omega-j)} & \frac{c\omega}{2(cr\omega-j)} & 0 & \frac{c\omega}{2(cr\omega-j)} \\ \frac{c\omega}{2(cr\omega-j)} & \frac{jc^2r\omega^2}{2(cr\omega-j)} - \frac{2c\omega}{cr\omega-j} + \frac{j}{2r(cr\omega-j)} & \frac{c\omega}{2(cr\omega-j)} & 0 \\ 0 & \frac{c\omega}{2(cr\omega-j)} & \frac{jc^2r\omega^2}{2(cr\omega-j)} - \frac{2c\omega}{cr\omega-j} + \frac{j}{2r(cr\omega-j)} & \frac{c\omega}{2(cr\omega-j)} \\ \frac{c\omega}{2(cr\omega-j)} & 0 & \frac{c\omega}{2(cr\omega-j)} & \frac{jc^2r\omega^2}{2(cr\omega-j)} - \frac{2c\omega}{cr\omega-j} + \frac{j}{2r(cr\omega-j)} \end{pmatrix}$$

PHASE SHIFTER WITH AN RC POLYPHASE FILTER

BACKGROUND OF THE INVENTION

1. Field of the Invention

The present invention relates to a phase shifter for performing orthogonal modulation/demodulation in digital communications and, more particularly, to a phase shifter using an RC filter composed of a resistive element and a capacitive element.

2. Description of the Prior Art

In digital communications, an orthogonal modulation/demodulation technology plays an important role. In orthogonal modulation/demodulation, two orthogonal local signals or high-frequency (RF) signals are used. The phase shifter is a circuit for generating an orthogonal signal, i.e., a signal having a phase difference of 90°. The phase shifter must have the following characteristics: (1) small phase and amplitude errors, (2) broad in band, and (3) low in power consumption.

Phase shifters are usually classified as (A) a type using an RC filter composed of a resistive element and a capacitive element, and (B) a type using a frequency divider compose of a flip-flop. The phase shifter of the type (B) has an advantage of small phase and amplitude errors in a broad band. In the phase shifter of the type (B), however, there are fundamental constraints imposed. That is, because of a necessity of a reference signal having a frequency higher by frequency division ratio times, an upper limit of an operation frequency is restricted by an operating limit of the flip-flop.

On the other hand, in the case of the phase shifter of the type (A), because of a fixed RC time constant in an integrated circuit, an amplitude error is increased only with a simple combination of a low pass filter and a high pass filter, and thus a correction circuit such as PLL must be added. A phase shifter using an all pass filter is also available. However, this phase shifter was impractical, because a ratio of elements necessary for achieving an RC constant made manufacturing of an integrated circuit difficult in most cases. In addition, when a frequency becomes higher, an RC time constant must be reduced. However, there is a limit to a capacity value for accurate formation in the integrated circuit. Thus, a value of resistance must be reduced, making it necessary to lower input impedance of the RC filter. For driving the RC filer, a current proportional to an inverse number of impedance of the RC filter is necessary. Consequently, as a frequency is higher, consumption of current is increased.

As an RC filter capable of obtaining an orthogonal signal broad in a band, and small in both amplitude and phase errors, a polyphase filter having resistive elements and capacitive elements cyclically connected is known. However, the polyphase filter is a 4-phase RC filter, where input impedance is smaller than that of a normal single phase RC filter. Thus, the polyphase filter must be used in small amplitude, or by increasing a driving current.

Figure 1:
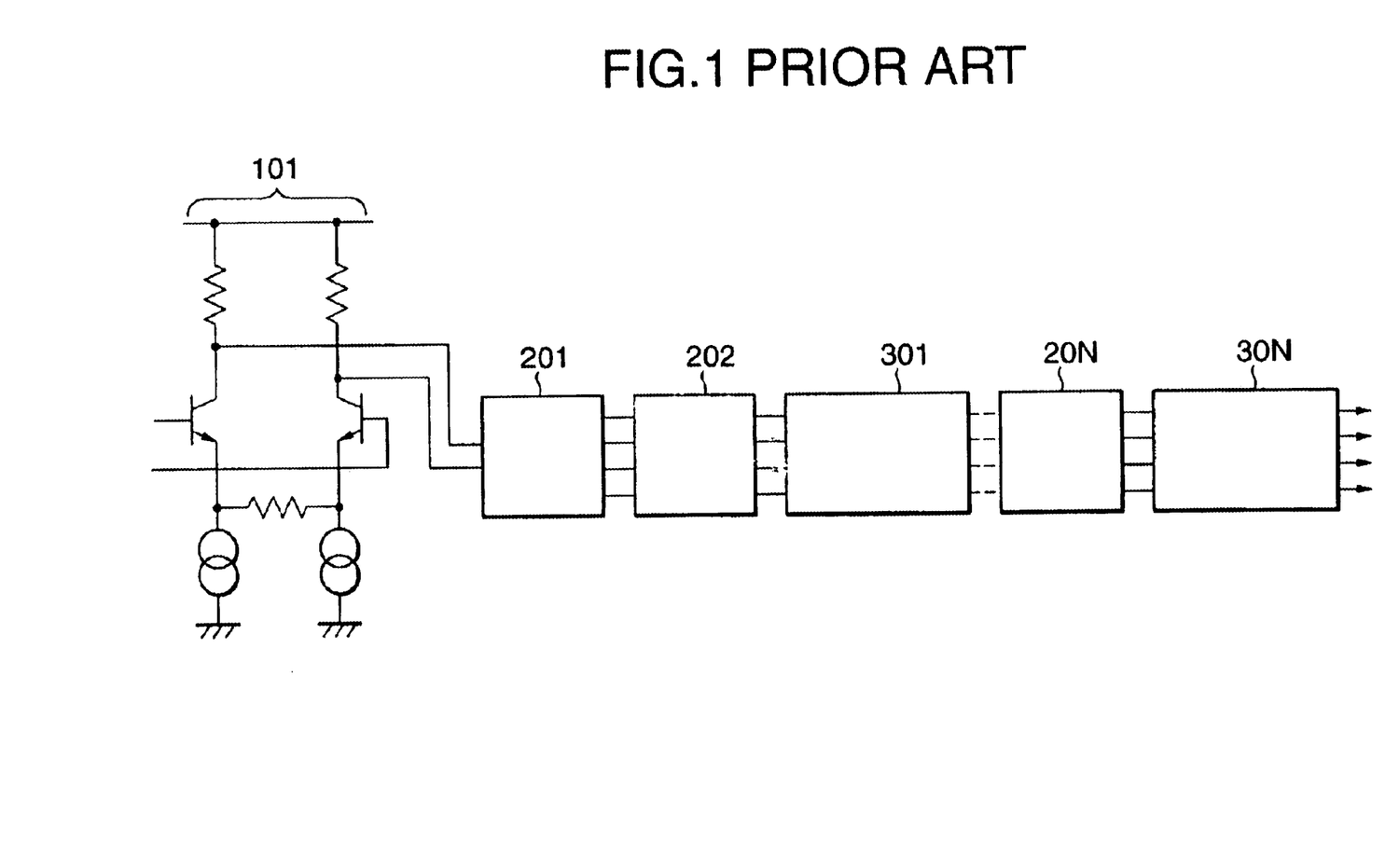
FIG. 1 is a block diagram showing an example of a phase shifter using conventional polyphase filters.

FIG. 1 is a block diagram of a conventional phase shifter described in Japanese Patent Application Laid-Open No. 11 (1999)-298293. This conventional phase shifter includes a differential amplifier 101 for driving, cascade-connected RC polyphase filters (simply referred to as polyphase filters, hereinafter) of N stages 201, . . . , 20N, and differential amplifiers 301, . . . , 30N used as buffer circuits. In this conventional phase shifter, the polyphase filter 201 is driven by the differential amplifier 101. However, since a large driving current cannot be supplied for the above-described reason, driving must be carried out by small amplitude. In addition, in order to achieve a broader band, a plurality of polyphase filters are cascade-connected. However, signal voltages are decayed at the polyphase filters 201, . . . , 20N. Thus, the differential amplifiers 301, . . . , 30N are provided between the polyphase filters to amplify the signal voltages. Because of such configuration, a circuit size was increased, creating a problem of an increase in power consumption. Especially, in a device driven by a battery such as a portable equipment, an increase in power consumption is not preferable, because it directly shortens use time.

SUMMARY OF THE INVENTION

The conventional phase shifter using the polyphase filters is advantageous in that a broad band can be achieved, and errors in both amplitude and phase can be suppressed. However, the necessity of providing the buffer differential amplifiers for driving with small amplitude has increased the circuit size, consequently increasing the power consumption.

The present invention is devised in view of such a circumstance, and an object of the invention is to provide a phase shifter improved for a reduction in power consumption, inheriting the advantages of the phase shifter using the polyphase filters, i.e., the capabilities of achieving a broad band, and suppressing errors in both amplitude and phase.

In order to achieve the above-described object, in accordance with an aspect of the present invention, there is provided a phase shifter, comprising: a voltage-to-current conversion circuit for receiving an input signal, converting a voltage value of the input signal into a current value, and outputting an input current signal; a polyphase filter composed of a plurality of cascade-connected stages of RC filters for receiving the input current signal, and outputting a polyphase phase-shifted current signal, each RC filter having resistive and capacitive elements connected alternately cyclically, one end of each resistive element being set an input terminal, and the other end of each resistive element being set as an output terminal; and a load circuit including a current-to-voltage conversion circuit for converting each current value of the polyphase phase-shifted current signal into a voltage value, and outputting a output signal. Since the voltage value of the input signal is converted into the current value, and supplied to the polyphase filter, the number of buffer circuits conventionally necessary for amplifying signals can be reduced, and consumption of power can be reduced.

According to the phase shifter of the invention, the voltage-to-current conversion circuit includes a differential amplifier composed of a first transistor having an emitter connected to a constant current source, one input signal as a balanced signal entered to a base, and a collector connected to one input terminal of the polyphase filter, and a second transistor having an emitter connected to the constant current source, the other input signal connected to a base, and a collector connected to the other input terminal of the polyphase filter, and a current signal corresponding to a voltage value of the input signal is supplied to the polyphase filter.

According to the phase shifter of the invention, the polyphase filter is constructed by cascade-connecting n stages ($n \geq 2$) of RC filters, each RC filter including a first resistor having one end connected to a first input terminal, and the other end connected to a first output terminal, a second resistor having one end connected to a second input terminal, and the other end connected to a second output terminal, a third resistor having one end connected to a third input terminal, and the other end connected to a third output terminal, a fourth resistor having one end connected to a fourth input terminal, and the other end connected to a fourth output terminal, a first capacitor having one end connected to the other end of the first resistor, and the other end connected to one end of the second resistor, a second capacitor having one end connected to the other end of the second resistor, and the other end connected to one end of the third resistor, a third capacitor having one end connected to the other end of the third resistor, and the other end connected to one end of the fourth resistor, and a fourth capacitor having one end connected to the other end of the fourth resistor, and the other end connected to one end of the first resistor, the first and second input terminals of the RC filer of the first stage in an input side are connected in common to enter one input current signal, the third and fourth input terminals are connected in common to enter the other input current signal, and first to fourth phase-shifted output current signals are outputted from the first to fourth output terminals of the RC filter of the n-th stage in an output side. Since the plurality of stages of RC filters are cascade-connected, a phase-shifting operation can be performed in a broader band.

According to the phase shifter of the invention, the load circuit includes first to fourth transistors having emitters respectively connected to the first to the fourth output terminals of the polyphase filter for outputting a 4-phase signal as the polyphase phase-shifted current signal, bases connected in common to a bias power source, and operated as current-to-voltage conversion circuits each for converting an input current value of the polyphase phase-shifted current signal into a voltage value, first to fourth load resistive elements having ends connected to collectors of the first to fourth transistors, and the other ends connected to a power source, a connection point between the first resistive element and the collector of the first transistor is set as an output terminal of an output signal of 0°, a connection point between the second resistive element and the collector of the second transistor is set as an output terminal of an output signal of 90°, a connection point between the third resistive element and the collector of the third transistor is set as an output terminal of an output signal of 180°, and a connection point between the fourth resistive element and the collector of the fourth transistor is set as an output terminal of an output signal of 270°. As output signals, signals phase-shifted by 0°, 90°, 180° and 270° can be obtained.

According to the phase shifter of the invention, the load circuit includes first and second transistors having emitters connected in common to the first output terminal of the polyphase filter for outputting a 4-phase signal as the polyphase phase-shifted current signal from each of the first to fourth output terminals, and constituting a first differential circuit, third and fourth transistors having emitters connected in common to the second output terminal of the polyphase filter, and constituting a second differential circuit, fifth and sixth transistors having emitters connected in common to the third output terminal of the polyphase filter, and constituting a third differential circuit, seventh and eighth transistors having emitters connected in common to the fourth output terminal of the polyphase filter, and constituting a fourth differential circuit, and first to fourth resistive elements having ends connected to a power source, bases of the first, third, fifth and seventh transistors are connected in common to be set as a first local signal input terminal, bases of the second, fourth, sixth and eighth transistors are connected in common to be set as a second local signal input terminal, a balanced local signal is supplied from the outside to the first local signal input terminal, a balanced local signal of opposite sign is supplied to the second local signal input terminal, a connection point, to which the other end of the first resistor and collectors of the first and fifth transistors are connected in common, is set as one output terminal of a in-phase output signal, a connection point, to which the other end of the second resistor and collectors of the second and sixth transistors are connected in common, is set as the other output terminal of the in-phase output signal, a connection point, to which the other end of the third resistor and collectors of the third and seventh transistors are connected in common, is set as one output terminal of an orthogonal-phase output signal, and a connection point, to which the other end of the fourth resistor and collectors of the fourth and eighth transistors are connected in common, is set as the other output terminal of the orthogonal-phase output signal. By entering an orthogonally modulated signal to the phase shifter, it is possible to perform orthogonal demodulation.

According to the phase shifter of the invention, the load circuit includes first and second transistors having emitters connected in common to the first output terminal of the polyphase filter for outputting a 4-phase signal as the polyphase phase-shifted current signal from each of the first to fourth output terminals, and constituting a first differential circuit, third and fourth transistors having emitters connected in common to the second output terminal of the polyphase filter, and constituting a second differential circuit, fifth and sixth transistors having emitters connected in common to the third output terminal of the polyphase filter, and constituting a third differential circuit, seventh and eighth transistors having emitters connected in common to the fourth output terminal of the polyphase filter, and constituting a fourth differential circuit, and first and second resistive elements having ends connected to a power source, bases of the first and sixth transistors are connected in common to be set as a first in-phase local signal input terminal, bases of the second and fifth transistors are connected in common to be set as a second in-phase local signal input terminal, bases of the third and eighth transistors are connected in common to be set as a first orthogonal-phase local signal input terminal, bases of the fourth and seventh transistors are connected in common to be set as a second orthogonal-phase local signal input terminal, a balanced in-phase local signal is supplied from the outside to the first in-phase local signal input terminal, a balanced in-phase local signal of opposite sign is supplied to the second in-phase local signal input terminal, a balanced orthogonal-phase local signal is supplied from the outside to the first orthogonal-phase local signal input terminal, a balanced orthogonal-phase local signal of opposite sign is supplied to the second orthogonal-phase local signal input terminal, a connection point, to which the other end of the first resistor and collectors of the first, third, fifth and seventh transistors are connected in common, is set as one output terminal of an output signal, and a connection point, to which the other end of the second resistor and collectors of the second, fourth, sixth and eighth transistors are connected in common, is set as the other output terminal of the output signal. This phase shifter can perform an image rejecting operation.

According to the phase shifter of the invention, the load circuit includes first and second transistors having emitters connected in common to the first output terminal of the polyphase filter for outputting a 4-phase signal as the polyphase phase-shifted current signal from each of the first to fourth output terminals, and constituting a first differential circuit, third and fourth transistors having emitters connected in common to the second output terminal of the polyphase filter, and constituting a second differential circuit, fifth and sixth transistors having emitters connected in common to the third output terminal of the polyphase filter, and constituting a third differential circuit, seventh and eighth transistors having emitters connected in common to the fourth output terminal of the polyphase filter, and constituting a fourth differential circuit, and first to fourth resistive elements having ends connected to a power source, bases of the first to eighth transistors are connected in common to a bias power source, a connection point, to which the other end of the first resistive element and collectors of the first and fourth transistors are connected in common, is set as one output terminal of an output signal phase shifted by 0°, a connection point, to which the other end of the second resistive element and collectors of the third and sixth transistors are connected in common, is set as an output terminal of an output signal phase-shifted by 90°, a connection point, to which the other end of the third resistive element and collectors of the fifth and eighth transistors are connected in common, is set as an output terminal of an output signal phase-shifted by 180°, and a connection point, to which the other end of the fourth resistive element and collectors of the second and seventh transistors are connected in common, is set as an output terminal of an output signal phase-shifted by 270°. This phase shifter can accurately shift phases in a very wide range when used in combination with an amplitude equalizer.

The foregoing, and other related objects and features become apparent upon reading of new items specified in the description made with reference to the accompanying drawings, and appended claims.

BRIEF DESCRIPTION OF THE DRAWINGS

FIGS. 7A and 7B are views, each showing an example of an operation according to the first embodiment.

DETAILED DESCRIPTION OF THE PREFERRED EMBODIMENTS

Next, description will be made of the preferred embodiments of the present invention with reference to the accompanying drawings. It should be understood that the embodiments described below are illustrative and not restrictive.

Figure 2:
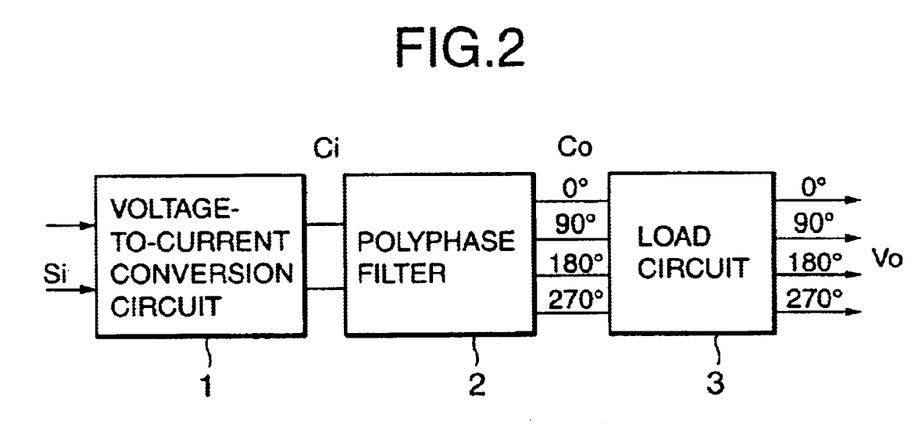
FIG. 2 is a block diagram showing a configuration of a phase shifter according to the present invention.

FIG. 2 is a block diagram showing the embodiment of the invention. A phase shifter of the invention includes a voltage-to-current conversion circuit 1, a polyphase filter 2, and a load circuit 3. This phase shifter receives input signals Si as balanced signals, and outputs phase-shifted output signals Vo different from each other by 90° in phase.

The voltage-to-current conversion circuit 1 receives a supply of the input signal Si, converts its voltage value into a current value, outputs the result as an input current signal Ci, and drives the polyphase filter 2 and the load circuit 3. The polyphase filter 2 is constructed by cascade-connecting RC circuits of predetermined stages, each RC circuit including a plurality of resistive elements, and capacitive elements equal in number to the resistive elements. The polyphase filter 2 receives input current signals Ci, and generates and outputs polyphase current signals different from each other by 90° in phase, i.e., 4-phase current signals Co. The load circuit 3 receives the 4-phase current signals Co outputted from the polyphase filter 2, converts the currents into voltages, and then outputs 4-phase output signals Vo.

The invention inherits features of a phase shifter using polyphase filters, i.e., a broad band, and small amplitude and phase errors. In addition, according to the invention, since the polyphase filter 2 is current-driven, and the load circuit 3 converts the polyphase current signal Co from the polyphase filter 2 into a voltage value, and then outputs the voltage value, it is possible to optionally set voltage amplitude of the phase output signal Vo by adjusting load impedance of the load circuit 3. Thus, the buffer circuits (differential amplifiers) needed by the conventional phase shifter of FIG. 1 can be omitted, making it possible to reduce consumption of power. If as the load circuit 3 of the phase shifter of the invention, not simply the load impedance but another circuit block is connected as a load, a signal operation at the other block of a set can be simultaneously carried out. Accordingly, the consumption of power can be reduced more.

Next, description is made of an operation of the invention by referring to FIG. 2. An input signal Si to be phase-shifted is entered to the voltage-to-current conversion circuit 1. The voltage-to-current conversion circuit 1 converts the input signal Si into a signal current, and outputs an input current signal Ci to the polyphase filter 2. The polyphase filter 2 is constructed by cascade-connecting the RC filters of a plurality of stages, each RC filter including resistive elements and capacitive elements connected alternately cyclically. The polyphase filter 2 phase-shifts the input current signal Ci, and outputs 4-phase current signals Co respectively phase-shifted by 0°, 90°, 180° and 270° to the load circuit 3. The load circuit 3 converts the phase-shifted current signals Co into voltage signals, and outputs phase-shifted output signals Vo.

Figure 3:
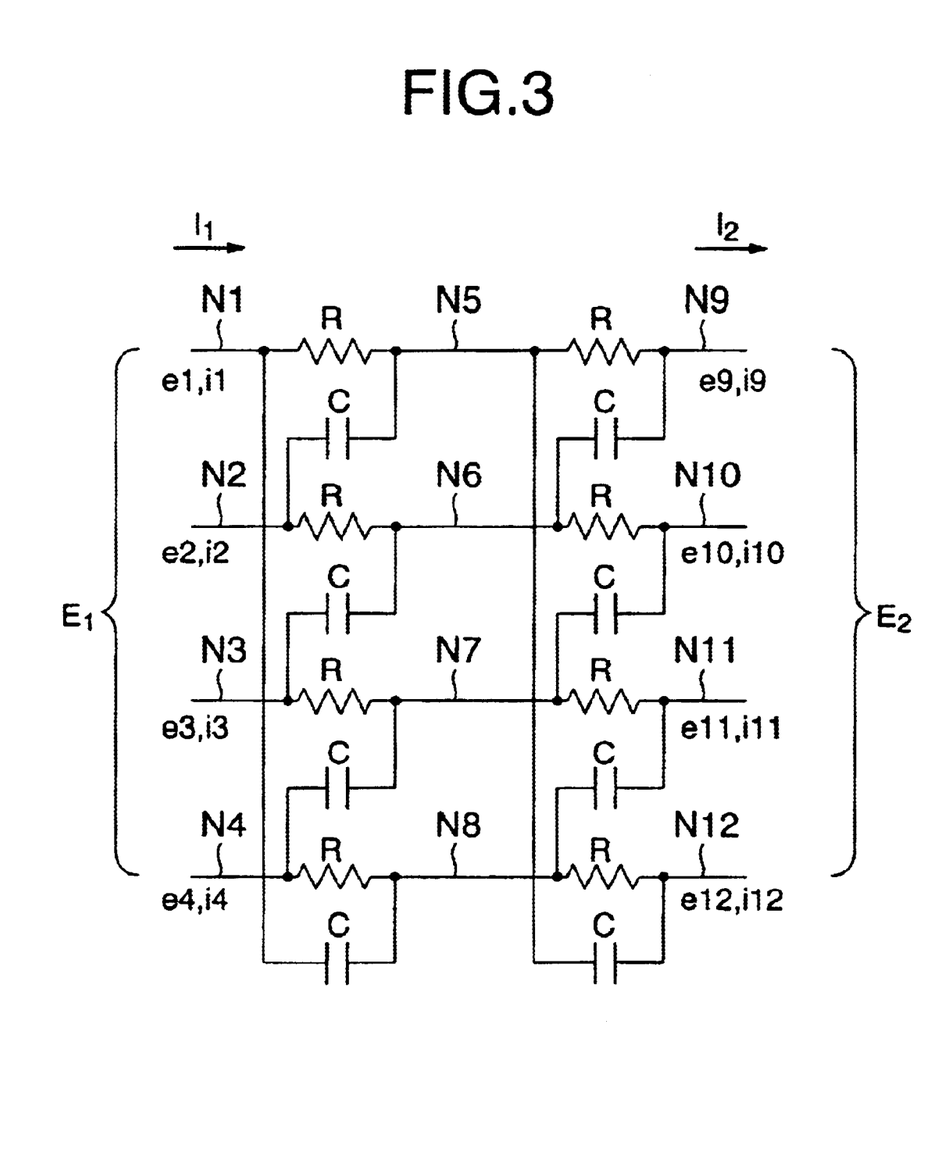
FIG. 3 is a circuit diagram showing an example of a configuration of a polyphase filter.

Now, description is made of an operation of the polyphase filter 2 by referring to FIG. 3, which is a circuit diagram showing a configuration example of the polyphase filter 2. For simplification of explanation, a case where the number of cascade-connected stages is two is described.

First, in the RC filter of an input stage, i.e., a first stage, four resistive elements (simply referred to as resistors, hereinafter) R are provided. Terminals of left sides (called input side for convenience) of the respective resistors are set to nodes N1, N2, N3 and N4, while terminals of right sides (called output sides for convenience) are set to nodes N5, N6, N7 and N8. Also, four capacitive elements (simply referred to as capacitors, hereinafter) C are provided: one between the nodes N2 and N5, one between the nodes N3 and N6, one between the nodes N4 and N7, and one between the nodes N1 and N8. In this way, the RC filter of the input stage is constructed. In other words, the RC filer of the input stage includes the resistors and the capacitors connected alternately cyclically. The RC filter of the input stage, and a similarly constructed RC filter of an output stage, i.e., a second stage, are cascade-connected to each other. In the RC filter of the output stage, four resistors R are provided. A terminal of the output side of the resistor having an input side set to a node N5 is set to a node N9; a terminal of the output side of the resistor having an input side set to a node N6 to a node N10; a terminal of the output side of the resistor having an input side set to a node N7 to a node N11; and a terminal of the output side of the resistor having an input side set to a node N8 to a node N12. Also, four capacitors C are provided: one between the nodes N6 and N9, one between the nodes N7 and N10, one between the nodes N8 and N11, and one between the nodes N5 and N12. In other words, the RC filer of the output stage also includes the resistors and the capacitors connected alternately cyclically.

Voltages of the nodes N1, N2, N3 and N4 are respectively set to e1, e2, e3 and e4, and currents of the nodes N1, N2, N3 and N4 are set to i1, i2, i3 and i4. A voltage $E_1$ and a current $I_1$ are represented in vector by the following equation. The capital letters E and I respectively denote a voltage vector, and a current vector:

$$E_1 = \begin{bmatrix} e1 \\ e2 \\ e3 \\ e4 \end{bmatrix}, I_1 = \begin{bmatrix} i1 \\ i2 \\ i3 \\ i4 \end{bmatrix}$$

Similarly, for the nodes N9, N10, N11, and N12, a voltage vector $E_2$ and a current vector $I_2$ are represented by the following equation. A direction of the current $I_2$ is indicated by an arrow:

$$E_2 = \begin{bmatrix} e9 \\ e10 \\ e11 \\ e12 \end{bmatrix}, I_2 = \begin{bmatrix} i9 \\ i10 \\ i11 \\ i12 \end{bmatrix}$$

An admittance matrix Y of this polyphase filter is represented by the following equation (1):

$$Y \begin{bmatrix} E_1 \\ E_2 \end{bmatrix} = \begin{bmatrix} I_1 \\ I_2 \end{bmatrix}, Y = \begin{bmatrix} Y_{11} & Y_{12} \\ Y_{21} & Y_{22} \end{bmatrix} \quad (1)$$

Figure 4:
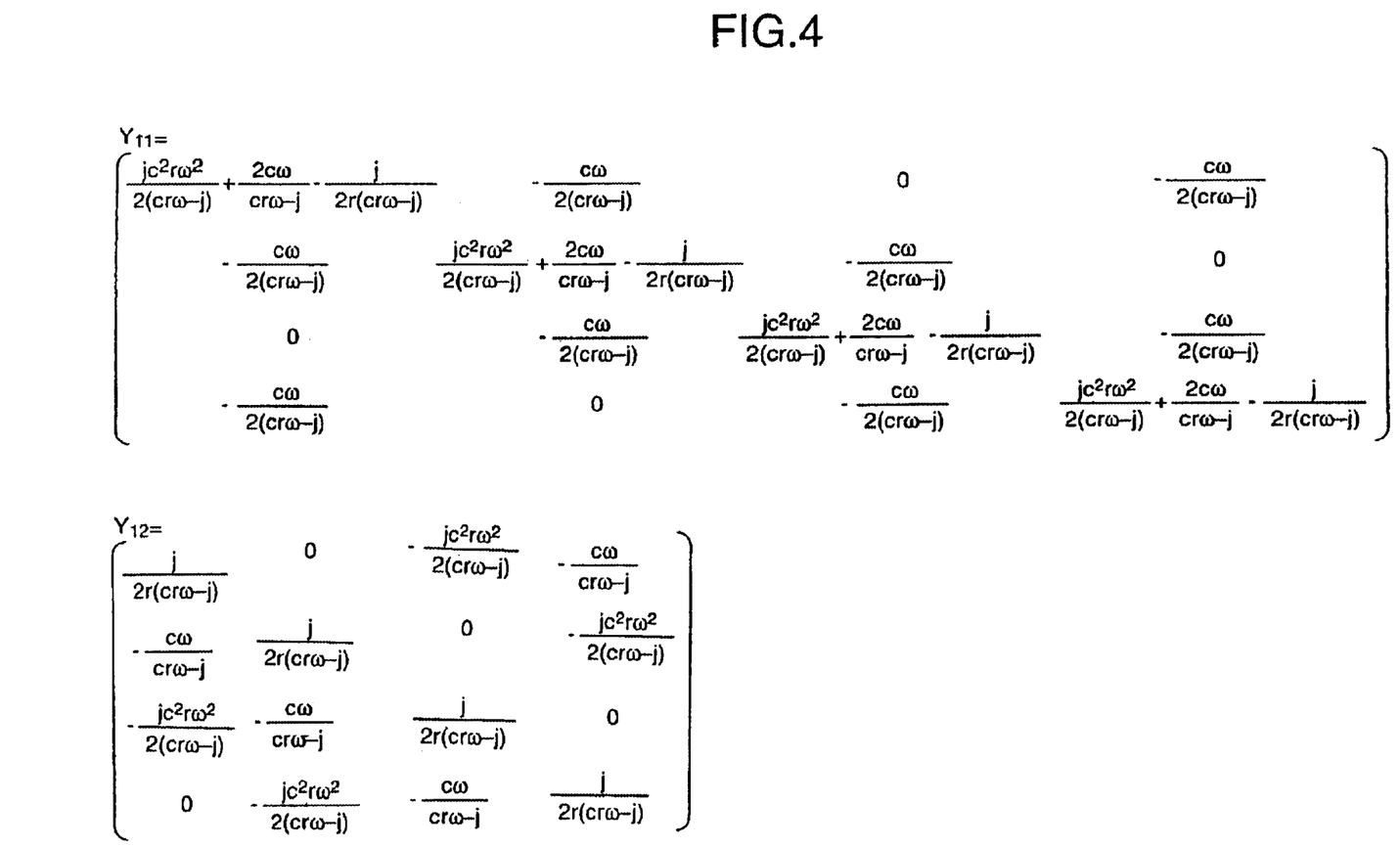
FIG. 4 is a view showing matrices of $Y_{11}$ and $Y_{12}$ in an equation (1).
Figure 5:
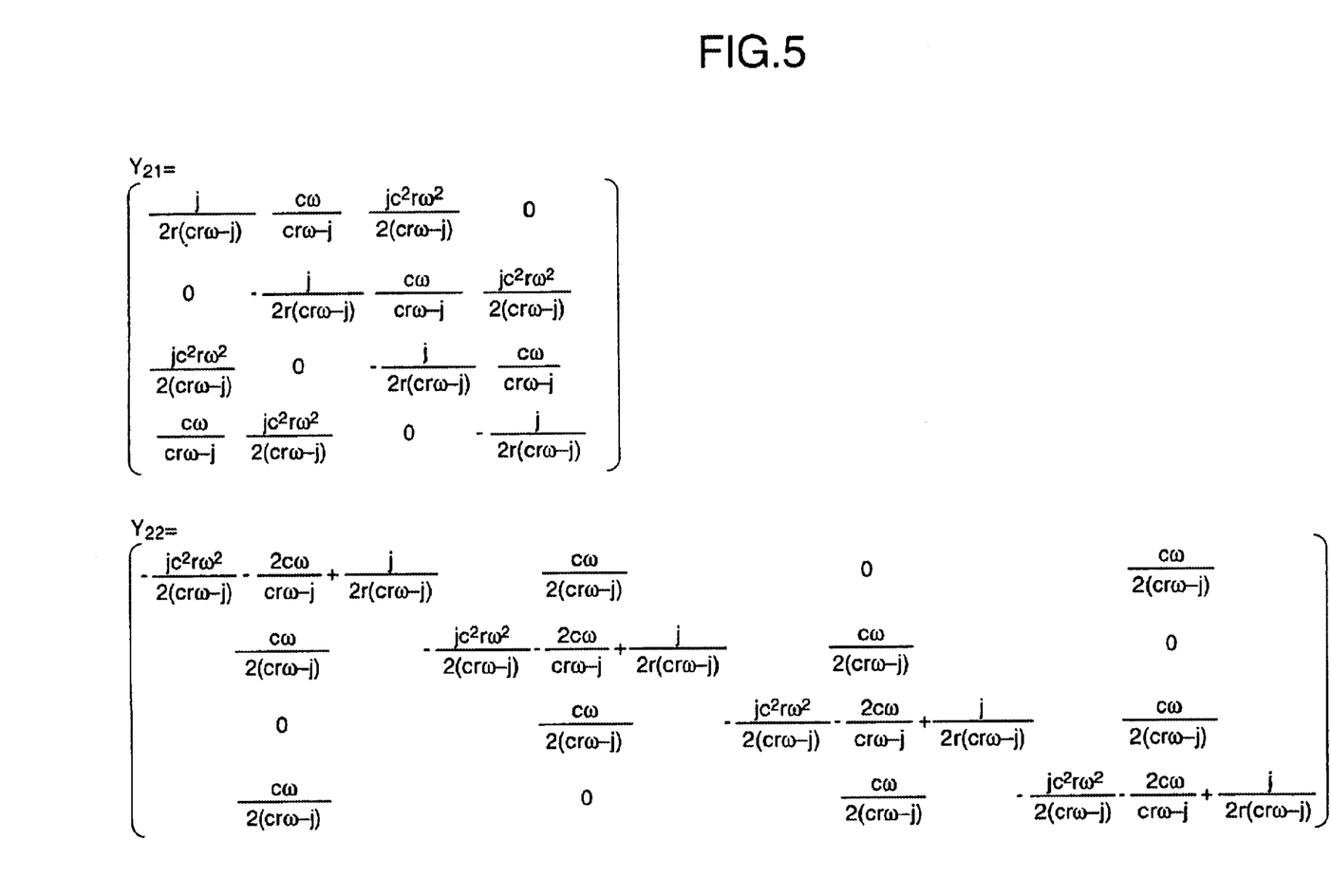
FIG. 5 is a view showing matrices of $Y_{21}$ and $Y_{22}$ in the equation (1).

$Y_{11}, Y_{12}, Y_{21}$, and $Y_{22}$ can be represented as shown in FIGS. 4 and 5. Here, a reference code $\omega$ denotes an angular frequency, c a reactance value of the capacitor C, r a resistance value of the resistor R, and j an imaginary unit.

A signal voltage appearing in an output when a signal voltage is applied to the polyphase filter of FIG. 3 is represented by the following equation using a G matrix obtained by transforming the Y matrix:

$$\begin{bmatrix} I_1 \\ E_2 \end{bmatrix} = G \begin{bmatrix} E_1 \\ I_2 \end{bmatrix}$$

A positive-phase sine wave voltage vin is applied to the nodes N1 and N2, an opposite-phase sine wave voltage –vin is applied to the nodes N3 and N4, and a current flowing out of the nodes N9, N10, N11 and N12 is made zero (open circuited). Then, a voltage $E_2$ and an input current $I_1$ appearing in the nodes N9, N10, N11 and N12 are represented by the following equations (2) and (3):

$$E_2 = \begin{bmatrix} \dfrac{vin(c^2r^2\omega^2 + 2jcr\omega + 1)}{-c^2r^2\omega^2 + 4jcr\omega + 1} \\ \dfrac{vin(c^2r^2\omega^2 - 2jcr\omega + 1)}{-c^2r^2\omega^2 + 4jcr\omega + 1} \\ \dfrac{vin(c^2r^2\omega^2 + 2jcr\omega + 1)}{c^2r^2\omega^2 - 4jcr\omega - 1} \\ \dfrac{vin(c^2r^2\omega^2 - 2jcr\omega + 1)}{c^2r^2\omega^2 - 4jcr\omega - 1} \end{bmatrix} \quad (2)$$

$$I_1 = \begin{bmatrix} \dfrac{4cvin\omega(cr\omega - j)}{c^2r^2\omega^2 - 4jcr\omega - 1} \\ \dfrac{4cvin\omega(cr\omega - j)}{c^2r^2\omega^2 - 4jcr\omega - 1} \\ -\dfrac{4cvin\omega(cr\omega - j)}{c^2r^2\omega^2 - 4jcr\omega - 1} \\ -\dfrac{4cvin\omega(cr\omega - j)}{c^2r^2\omega^2 - 4jcr\omega - 1} \end{bmatrix} \quad (3)$$

When equality is established with a cutoff frequency decided by $\omega = (1/cr)$, $E_2$ and $I_i$ are represented by the following equations (4) and (5):

$$E_2 = \begin{bmatrix} \dfrac{1-j}{2}vin \\ \dfrac{-1-j}{2}vin \\ \dfrac{-1+j}{2}vin \\ \dfrac{1+j}{2}vin \end{bmatrix} \quad (4)$$

$$I_1 = \begin{bmatrix} \dfrac{1+j}{r}vin \\ \dfrac{1+j}{r}vin \\ -\dfrac{1+j}{r}vin \\ -\dfrac{1+j}{r}vin \end{bmatrix} \quad (5)$$

Since matrix transformation is complex and redundant, calculations in the midway are omitted. A voltage of each component of E2, i.e., each of the nodes N9, N10, N11 and N12 is on a circle of a radius vin/($\sqrt{2}$) on a complex plane and, for example, e9 is at an angle of deviation –45°, and e10 at an angle of deviation –135°. If e9 is set as a reference, e10, e11 and e12 are delayed in phase respectively by 90°, 180° and 270°. Accordingly, it can be verified that four outputs are phase-shifted by 90°. If for example, a phase difference between e9 and e10 is calculated from the equation (2), the following equation (6) is established:

$$\tan^{-1}\dfrac{e9}{e10} = \tan^{-1}\dfrac{1 + 2jcr\omega + c^2r^2\omega^2}{1 - 2jcr\omega + c^2r^2\omega^2} \quad (6)$$

Assuming that a permissible range of a phase error is 1°, by obtaining a value of $\omega$, where a value of the equation (6)

is in a range of 89° to 90°, an operation range of the phase shifter can be calculated to be between ω=0.829/cr and ω=1.206/cr.

It can be understood that in a ratio of e9 and e10 in an arc tangent function of the equation (6), since only polarities of imaginary parts of a numerator and a denominator are different, no amplitude errors occur.

$$\frac{e9}{e10} = \frac{1 + 2jcr\omega + c^2r^2\omega^2}{1 - 2jcr\omega + c^2r^2\omega^2} \quad (10)$$

In order to further widen the 90° phase-shifting operation range of the phase shifter, the number of cascade-connected stages of RC filters needs only to be increased to, e.g., three, four stages and the like. However, as the number of stages is increased, a reduction in an output voltage is larger. From the equation (5), it can be understood that input impedance of the polyphase filter of this example is $r/(\sqrt{2})$.

For example, when a phase shifter operated by 1 GHz is designed, assuming that a capacitor c installed in an integrated circuit is 1 pF, a necessary resistance value is represented by r=1/(2π×1 GHz×1 pF)=160 Ω. In the polyphase filter of cascade-connected two stages of this example, a load becomes about 57 Ω when the nodes N1 and N2 are connected to each other, and when the nodes N3 and N4 are connected to each other, and a large current is necessary for driving with such low impedance. For example, a signal voltage necessary as a local signal of a most often used double balanced mixer is 100 to 200 mV at a peak-to-peak value. To obtain this signal voltage, the above described load of about 57 Ω is driven by a voltage of 140 to 280 mV at a peak-to-peak value, necessitating a sine wave current of 2.5 mA to 5 mA to be supplied without any distortions. Thus, consumption of current becomes very large. It is not practical to supply such a large current in the integrated circuit. Thus, as in the case of the conventional phase shifter described above with reference to FIG. 1, the polyphase filter is used by setting amplitude of an input signal voltage to be small, and amplifying its output voltage with a buffer circuit. However, since the buffer circuit composed of a differential amplifier itself consumes a great deal of power, consumption of power becomes large especially when the polyphase filter is composed of multistages, creating a need to reduce the consumption of power much more.

According to the invention, the polyphase filter is driven not by a voltage but by a current and, by using its output current so as to make the buffer circuit unnecessary, low consumption of power can be achieved.

In order to supply a current to the polyphase filter 2, and calculate an output current, an H matrix represented by the following equation is used:

$$\begin{bmatrix} E_1 \\ I_2 \end{bmatrix} = H \begin{bmatrix} I_1 \\ E_2 \end{bmatrix}$$

When an input current iin is applied to the nodes N1 and N2, and –iin to the nodes N3 and N4, assuming that an output voltage $E_2$ is 0 (short-circuited), calculation of an output current $I_2$ carried out by transforming the Y matrix into an H matrix is represented by the following equation (7):

$$I_2 = \begin{bmatrix} \frac{iin(c^2r^2\omega^2 + 2jcr\omega + 1)}{-c^2r^2\omega^2 + 4jcr\omega + 1} \\ \frac{iin(c^2r^2\omega^2 - 2jcr\omega + 1)}{-c^2r^2\omega^2 + 4jcr\omega + 1} \\ \frac{iin(c^2r^2\omega^2 + 2jcr\omega + 1)}{c^2r^2\omega^2 - 4jcr\omega + 1} \\ \frac{iin(c^2r^2\omega^2 - 2jcr\omega + 1)}{c^2r^2\omega^2 - 4jcr\omega + 1} \end{bmatrix} \quad (7)$$

A following equation (8) is obtained with ω=(1/cr)

$$I_2 = \begin{bmatrix} \frac{1-j}{2}iin \\ \frac{-1-j}{2}iin \\ \frac{-1+j}{2}iin \\ \frac{1+j}{2}iin \end{bmatrix} \quad (8)$$

These equations are similar to the equations (2) and (4), only difference being that vin is replaced with iin. Thus, it can be understood that a phase-shifting operation is carried out as in the case of the operation driven by the voltage. If this output current is supplied to load impedance ZL, a signal current can be converted into a signal voltage iin×ZL. Although iin and ZL depend on a dynamic range decided by a speed of an active element, and a power supply voltage, ranges thereof can be optionally selected, and a more preferable output signal voltage can be obtained.

Figure 6:
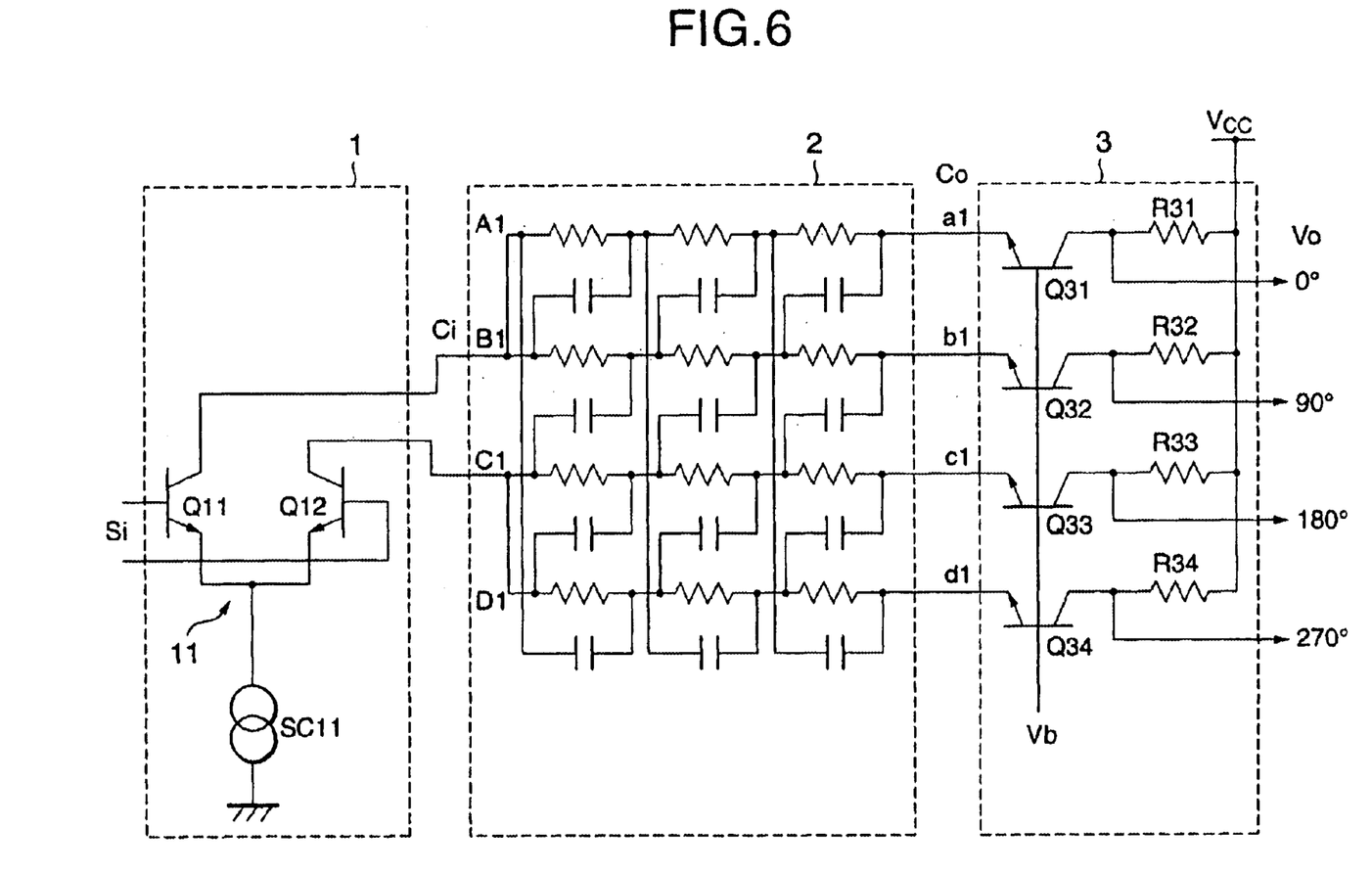
FIG. 6 is a circuit diagram showing a configuration of a phase shifter according to a first embodiment of the invention.

FIG. 6 is a circuit diagrams showing a configuration of a phase shifter according to a first embodiment of the present invention. As shown in FIG. 6, a voltage-to-current conversion circuit 1 includes a differential amplifier 11 having transistors Q11 and Q12, which are constructed in such a manner that emitters connected in common are connected to a constant current source SC11, one and the other signals Si as balanced signals are entered to respective bases, connector are connected to one and the other input terminals of a polyphase filter 2, and current signals Ci corresponding to voltage values of the input signals Si are supplied to the polyphase filter 2.

The polyphase filter 2 is composed of the polyphase filers described above with reference to FIG. 3, which are cascade-connected in three stages. That is, a similar RC filer is inserted between the RC filters of input and output stages. The polyphase filter 2 includes two input terminals for receiving one and the other input current signals Ci, and four terminals a1, b1, c1 and d1 for outputting 4-phase signals. In the embodiment, terminals A1 and B2 of an input side respectively corresponding to the terminals a1 and b1 in a DC manner are connected in common, and one of the input current signal Ci is entered thereto. Terminals C1 and D1 of the input side respectively corresponding to the terminals c1 and d1 in a DC manner are connected in common, and the other of the input current signal Ci is entered thereto.

A load circuit 3 includes transistors Q31, Q32, Q33 and Q34, and load resistors R31, R32, R33 and R34: the transistors Q31 to Q34 having emitters respectively connected to the output terminals a1, b1, c1 and d1 of the polyphase filter 2, and bases connected in common to a bias voltage Vb, and the resistors R31 to R34 having ends connected to respective collectors of the transistors Q31 to Q34, and the other ends connected in common to a power source Vcc. The transistors Q31 to Q34 operate as current-to-voltage conversion circuits for converting input current values from the terminals a1, b1, c1 and d1 into voltage values by performing base grounding operations.

Now, description is made of an operation of the embodiment by referring to FIG. 6. The differential amplifier 11 constituting the voltage-to-current conversion circuit 1 converts an input signal Si of an input voltage value into a signal current, and outputs an input current signal Ci to the polyphase filter 2. The polyphase filter 2 receives the input current signal Ci, and outputs current signals respectively phase-shifted by 0°, 90°, 180° and 270° from the terminals a1, b1, c1 and d1. The outputted 4-phase current signal Co is supplied to the load circuit 3. The load circuit 3 converts the phase-shifted current signal Co into a voltage signal, and outputs a voltage signal phase-shifted by 0° from a connection point between the transistor Q31 and the resistor 31, a voltage signal phase-shifted by 90° from a connection point between the transistor Q32 and the resistor R32, a voltage signal phase-shifted by 180° from a connection point between the transistor Q33 and the resistor R33, and a voltage signal phase-shifted by 270° from a connection point between the transistor Q34 and the resistor R34. Thus, a 4-phase output signal containing the signals phase-shifted by 90°, 180°, and 270° is generated and outputted.

With the configuration of the embodiment, it is possible to set an output of the polyphase filter 2 to be an operation point near a ground, and efficiently take out a current output of the polyphase filter 2.

Figure 7A:
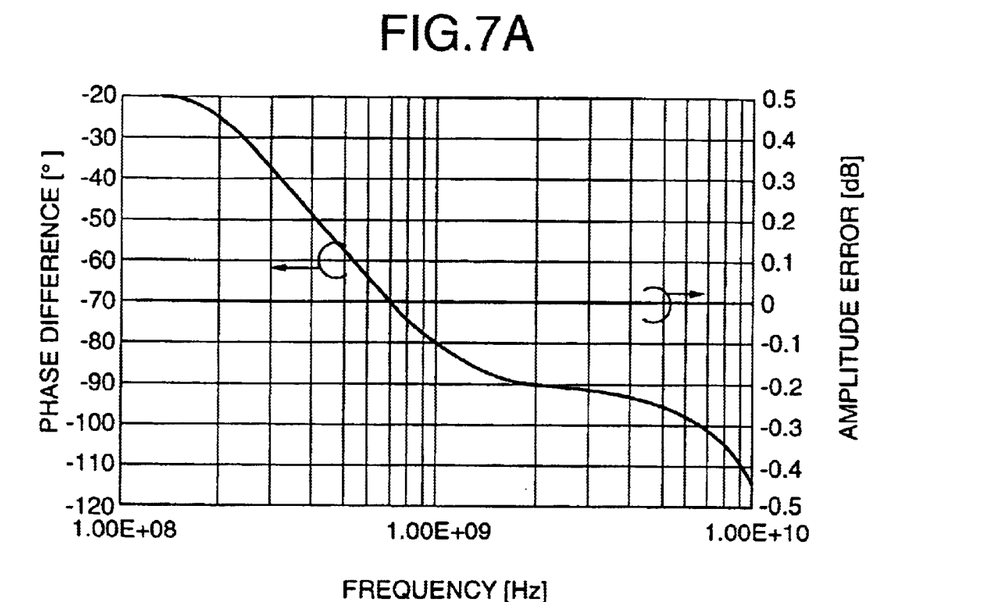
FIG. 7A a graph showing a result of small signal analysis.
Figure 7B:
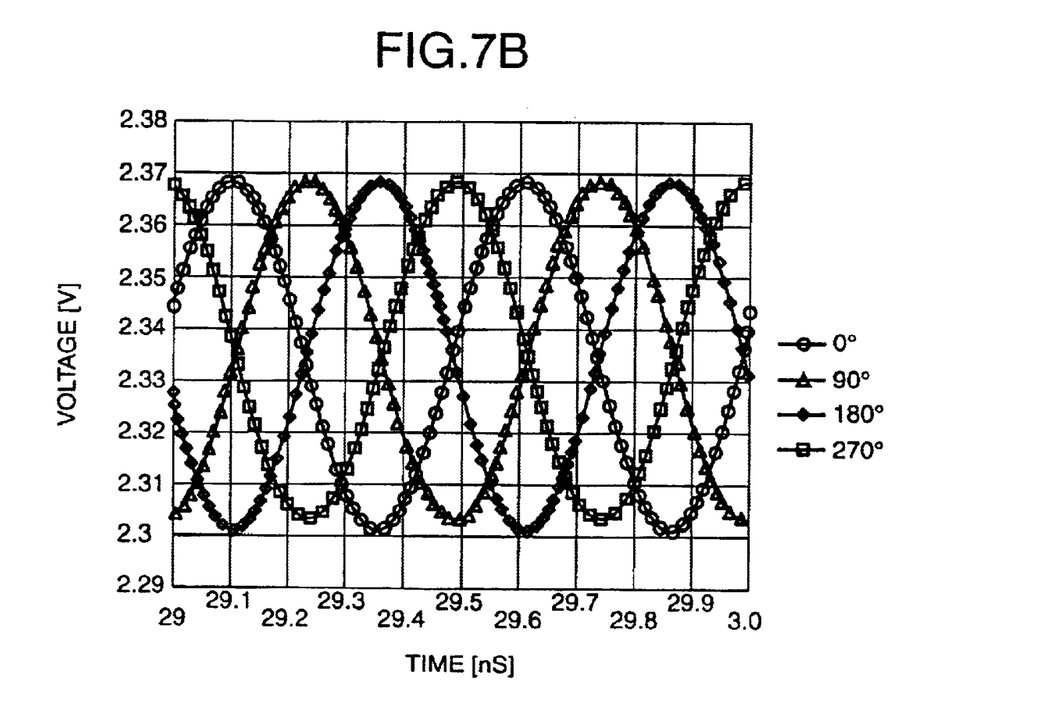
FIG. 7B a waveform chart showing a result of transient analysis.

As an example, FIG. 7A shows a result of calculating a phase difference and an amplitude error between the phases 0° and 90° of outputs by small signal simulation in the embodiment, assuming that r=63 Ω and c=1 pF are set for a time constant of the polyphase filter, a resistance value RL=1 Ω is set for the resistors R31, R32, R33 and R34, and an emitter current of the differential amplifier 1 is set to 1.5 mA. An amplitude error is 0 dB in all bands, and a range of a phase error of ±1° is 1.68 GHz to 3.8 GHz. When a signal of 2 GHz, and 100 mV at a peak-to-peak value as a balanced input signal Si was supplied to the input of the differential amplifier 1, an appearing signal voltage was 68 mV at a peak-to-peak value in each phase. A result of this calculation is shown in FIG. 7B.

FIG. 6 showed the example of the polyphase filter composed of three-stage RC filters. However, the embodiment is not restrictive in this regard, and the number of RC filter stages constituting the polyphase filter can be optionally set to n (n≧2).

Figure 8:
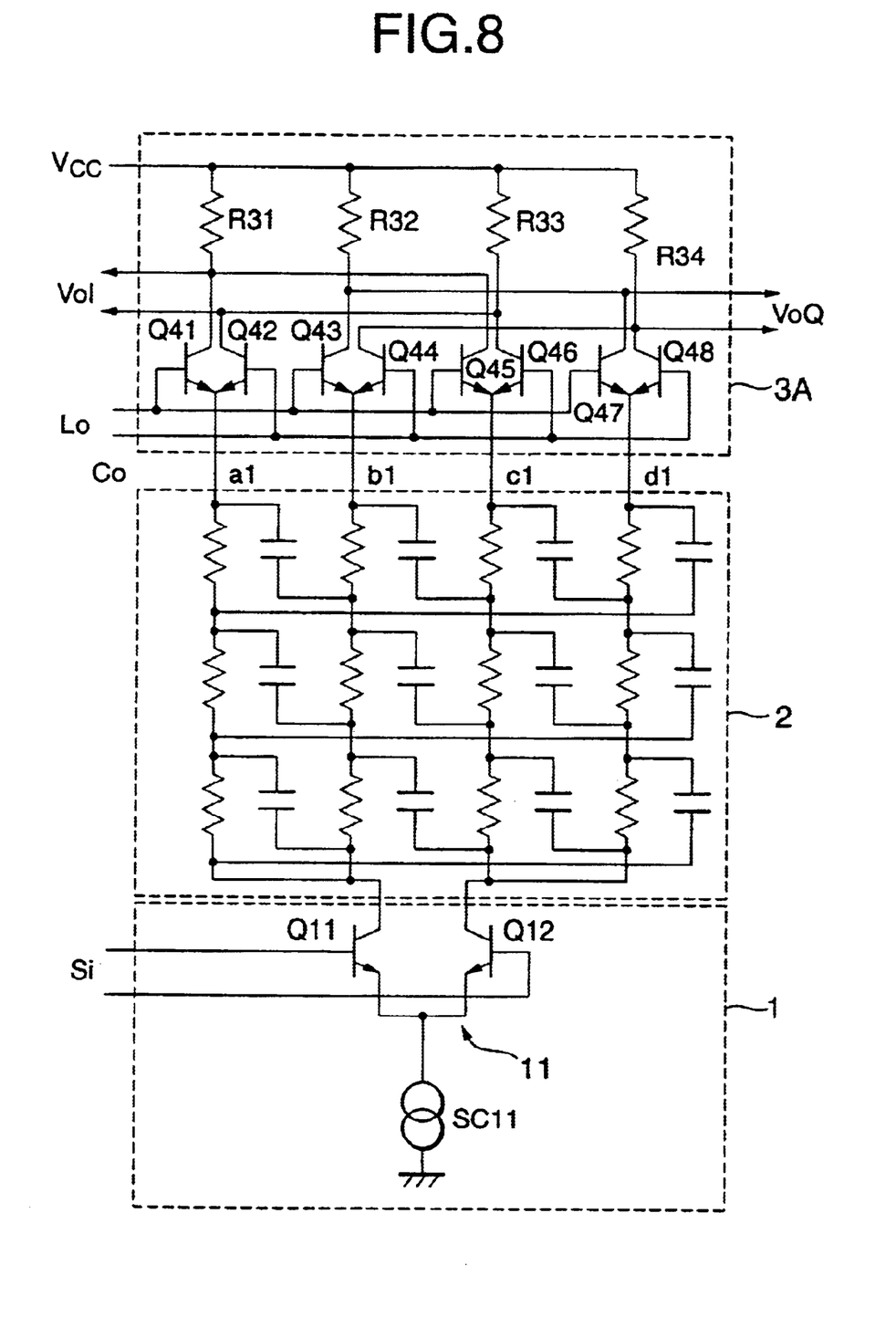
FIG. 8 is a circuit diagram showing a phase shifter according to a second embodiment of the invention.

FIG. 8 is a circuit diagram showing a second embodiment of the present invention. Components similar to those of FIG. 6 are denoted by similar reference codes/numerals. A difference from the first embodiment shown in FIG. 6 is that in place of the load circuit 3, a load circuit 3A is provided, which has two double differential circuits including transistors Q41, Q42, Q43, Q44, Q45, Q46, Q47 and Q48, and resistors R31, R32, R33 and R34. In the embodiment, the load circuit 3A constitutes a double balanced mixer, and can perform orthogonal demodulation by a single balanced local signal.

Now, detailed description is made of the load circuit 3A of the embodiment. For 4-phase output terminals a1, b1, c1 and d1 of a polyphase filter 2, commonly connected emitters (referred to as common emitters, hereinafter) of the differential circuit composed of the transistors Q41 and Q42 are connected to the terminal a1. Similarly, common emitters of the differential circuit composed of the transistors Q43 and Q44 are connected to the terminal b1; common emitters of the differential circuit composed of the transistors Q45 and Q46 to the terminal c1; and common emitters of the differential circuit composed of the transistors Q47 and Q48 to the terminal d1. Bases of the transistors Q41, Q43, Q45 and Q47 are connected in common to be set as one local signal input terminal, and bases of the transistors Q42, Q44, Q46 and Q48 are connected in common to be set as the other local signal input terminal. One and the other balanced local signals separately generated are entered to one and the other local signal input terminals. The load resistor R31 is provided between a connection point and a power source Vcc, to which collectors of the transistors Q41 and Q45 are connected in common, and this connection point is used as one output terminal of a in-phase signal VoI. Similarly, the load resistor R33 is provided between a connection point and a power source Vcc, to which collectors of the transistors Q42 and Q46 are connected in common, and this connection point is used as the other output terminal of the in-phase signal VoI. The load resistor R32 is provided between a connection point and a power source Vcc, to which collectors of the transistors Q43 and Q47 are connected in common, and this connection point is used as one output terminal of an orthogonal signal VoQ. Similarly, the load resistor R34 is provided between a connection point and a power source Vcc, to which collectors of the transistors Q44 and Q48 are connected in common, and this connection point is used as the other output terminal of the orthogonal signal VoQ.

That is, the transistors Q41, A42, Q45 and Q46 constitute a first double differential circuit, and the transistors Q43, Q44, Q47 and Q48 constitute a second double differential circuit.

In the terminals a1, b1, c1 and d1 of the polyphase filter 2, if the terminal a1 is set as a reference, currents having phase differences of 0°, 90°, 180° and 270° are supplied. Between the terminals a1 and c1, outputs are balanced, i.e., a phase difference is 180°, and the double differential circuit composed of the transistors Q41, Q42, Q45 and Q46 is operated as a so-called double balanced mixer.

Since the load circuit 3A is a double balanced mixer, the phase shifter of the embodiment divides an input signal Si entered to the differential amplifier 11 into two signals phase-shifted from each other by 90° simultaneously convert frequencies thereof, and outputs a in-phase output signal VoI and an orthogonal output signal VoQ. In other words, according to the embodiment, by entering an orthogonally modulated input signal Si to the differential amplifier 11, it is possible to perform orthogonal demodulation by a single balanced local signal Lo.

FIG. 8 shows the example, where the polyphase filter is composed to the RC filers of three stages. However, the invention is not limited to this example, and the number of stages of RC filers constituting the polyphase filter can be optionally set to n (n≧2).

Figure 9:
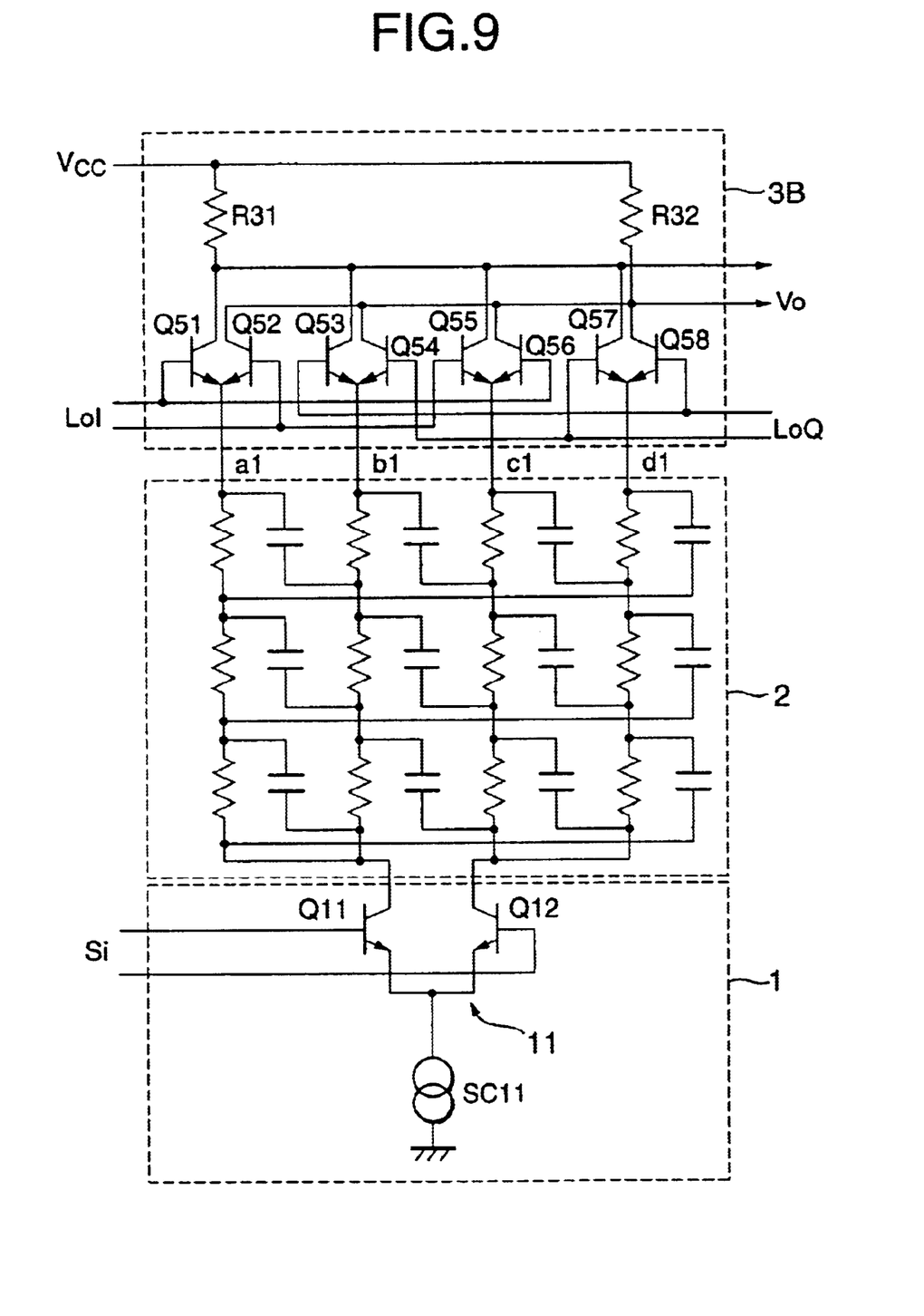
FIG. 9 is a circuit diagram showing a phase shifter according to a third embodiment of the invention.

FIG. 9 is a circuit diagram showing a third embodiment of the present invention. Components similar to those of FIG. 8 are denoted by similar reference codes/numerals. A difference from the second embodiment shown in FIG. 8 is that in place of the load circuit 3A, a load circuit 3B is provided, which has two double differential circuits including transistors Q51, Q52, Q53, Q54, Q55, Q56, Q57 and Q58, and resistors R31 and R32. Each double differential circuit includes two differential circuits. In the embodiment, the load circuit 3B constitutes a double balanced mixer for receiving a in-phase local signal LoI of a balanced signal, and an orthogonal-phase local signal LoQ of a balanced signal different in phase by 90° from the local signal LoI, and outputting an output signal Vo.

Now, detailed description is made of the load circuit 3B of the embodiment. For 4-phase output terminals a1, b1, c1 and d1 of a polyphase filter 2, commonly connected emitters of the differential circuit composed of the transistors Q51 and Q52 are connected to the terminal a1. Similarly, common emitters of the differential circuit composed of the transistors Q53 and Q54 are connected to the terminal b1; common emitters of the differential circuit composed of the transistors Q55 and Q56 to the terminal c1; and common emitters of the differential circuit composed of the transistors Q57 and Q58 to the terminal d1. In the embodiment, bases of the transistors Q51 and Q56 are connected in common to supply one in-phase local signal LoI; and bases of the transistors Q52 and Q55 are connected in common to supply the other in-phase local signal LoI. Bases of the transistors Q53 and Q58 are connected in common to supply one orthogonal-phase local signal LoQl; and bases of the transistors Q54 and Q57 are connected in common to supply the other orthogonal-phase local signal LoQ.

The load resistor R31 is provided between a connection point and a power source Vcc, to which collectors of the transistors Q51, Q53, Q55 and Q57 are connected in common, and this connection point is used as one output terminal of an output signal Vo. Similarly, the load resistor R32 is provided between a connection point and a power source Vcc, to which collectors of the transistors Q52, Q54, Q56 and Q58 are connected in common, and this connection point is used as the other output terminal of the output signal Vo.

As a result, for output signals of the output terminals a1 and c1 of the polyphase filter 2, a double balanced mixer operation is performed by the double differential circuit composed of the transistors Q51, Q52, Q55 and Q56. For output signals of the output terminals b1 and d1 of the polyphase filter 2, a double balanced mixer operation is performed by the double differential circuit composed of the transistors Q53, Q54, Q57 and Q58. Accordingly, an output signal Vo becomes a synthesized signal of these two double balanced mixers.

Now, consideration is given to an operation in this case. Assuming that an angular frequency of an input signal Si of the differential amplifier 11 is $\omega_{RF}$, and absolute values of amplitude and phase are not considered for simplification, RFI=cos ($\omega_{RF}t$) is outputted to the output terminals a1 and c1 of the polyphase filter 2 and, similarly, RFQ=sin ($\omega_{RF}t$) is supplied to the output terminals b1 and d1. Assuming that angular frequencies of a in-phase local signal LoI and an orthogonal-phase local signal LoQ are both $\omega_{Lo}$, and absolute values of amplitude and phase are not considered, LoI=cos ($\omega_{Lo}t$), and LoQ=sin ($\omega_{Lo}t$) can be established. As is well known, a mixer is a multiplier. Thus, these are multiplied in first approximation, a load is selected so as to have a conversion gain of 1, and addition of these is represented by the following equation (9):

$$RFI \times LoI + RFQ \times LoQ = \cos(\omega_{RF}t) \times \cos(\omega_{Lo}t) + \sin(\omega_{RF}t) \times \sin(\omega_{Lo}t) = \cos(\omega_{RF}-\omega_{Lo})t \quad (9)$$

As apparent from the above equation, in the load circuit 3B of the embodiment, a term of cos ($\omega_{RF}+\omega_{Lo}$) generated by multiplication is removed. That is, an image rejecting operation is carried out.

FIG. 9 shows the example, where the polyphase filter is composed to the RC filers of three stages. However, the invention is not limited to this example, and the number of stages of RC filers constituting the polyphase filter can be optionally set to n (n≧2).

Figure 10:
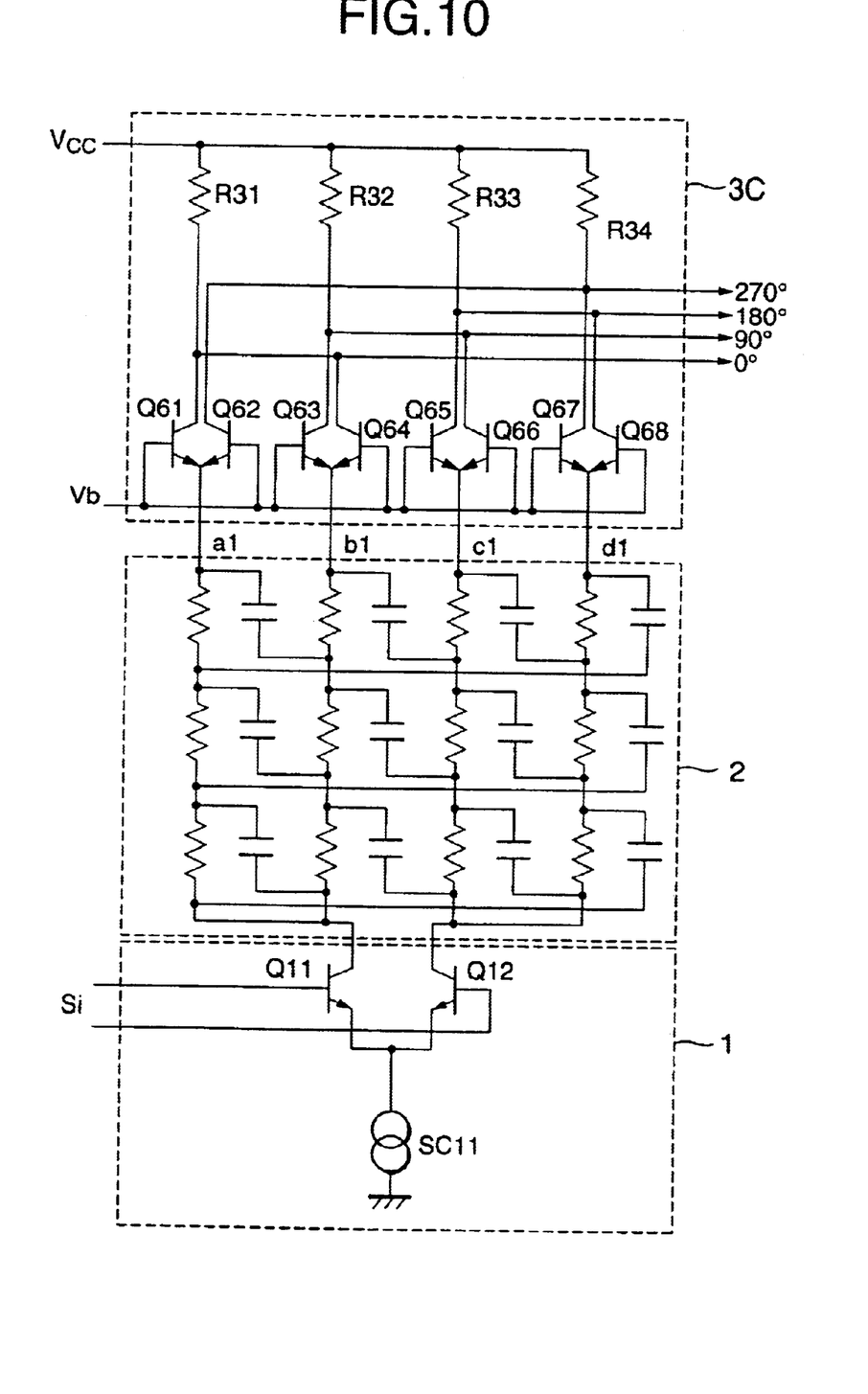
FIG. 10 is a circuit diagram showing a phase shifter according to a fourth embodiment.

FIG. 10 is a circuit diagram showing a fourth embodiment of the present invention. Components similar to those of FIG. 6 are denoted by similar reference codes/numerals. A difference from the first embodiment shown in FIG. 6 is that in place of the load circuit 3, a load circuit 3C is provided, which has four differential circuits including transistors Q61, Q62, Q63, Q64, Q65, Q66, Q67 and Q68, and resistors R31, R32, R33 and R34, and outputs a 4-phase output signal.

Now, description is made of an operation of the embodiment by referring to FIG. 10. Signal currents phase-shifted by 0°, 90°, 180° and 270° with a1 set as a reference are outputted to 4-phase output terminals a1, b1, c1 and d1 of the polyphase filter 2. Considering a ratio of (i9+i10) and (i9−i10) in FIG. 3, the following equation (10) is established, leaving only a term of an imaginary number:

$$\frac{i9 + i10}{i9 - i10} = -\frac{j}{2cr\omega} - \frac{jcr\omega}{2} \quad (10)$$

That is, at all the frequencies, (i9+i10)/(i9−i10) is phase-shifted by 90°. For amplitude, when ω is 1/cr, (i9+i10)/(i9−i10) becomes −j, realizing equality in amplitude. However, as a frequency is shifted from 1/cr, an amplitude error is increased.

Such an increase of an amplitude error can be corrected by adding, for example an amplitude equalizer such as a limiter. Especially, by presetting an RC time constant to match a highest operation frequency, and making constant amplitude in a frequency lower than that by the amplitude equalizer, it is possible to obtain a phase shifter capable of shifting a phase by 90° accurately in a very wide range.

The embodiment is designed to achieve the above-described function. For the output terminals a1, b1, c1 and d1 of a polyphase filter 2, common emitters of the differential circuit composed of the transistors Q61 and Q62 are connected to the terminal a1; common emitters of the differential circuit composed of the transistors Q63 and Q64 to the terminal b1; common emitters of the differential circuit composed of the transistors Q65 and Q66 to the terminal c1; and common emitters of the differential circuit composed of the transistors Q67 and Q68 to the terminal d1. Bases of the transistors Q61, Q62, Q63, Q64, Q65, Q66, Q67 and Q68 are connected to a bias voltage source Vb. The load resistor R31 is provided between a connection point and a power source Vcc, to which collectors of the transistors Q61 and Q64 are connected in common, and this connection point is used as an output terminal of a 0° output signal. In this way, currents flowing to the output terminals a1 and b1 of the polyphase filter 2 are summed to obtain a 0° output signal.

For a difference, since there is an opposite-phase relation between a current signal outputted from the terminal b1 and a current signal outputted from the terminal d1, a current outputted from the terminal a1 and a current outputted from the terminal d1 only need to be summed. The load resistor R34 is provided between a connection point and a power source Vcc, to which collectors of the transistors Q62 and Q67 are connected in common, and this connection point is used as an output terminal of an output signal, i.e., a 270° output signal. Similarly, for the terminals a1 and d1, the loads resistor R32 is provided between a connection point and a power source Vcc, to which collectors of the transistors Q63 and Q66 are connected in common, and this connection point is used as an output terminal of a 90° output signal. The load resistor R33 is provided between a connection point and a power source Vcc, to which collectors of the transistors Q65 and Q68 are connected in common, and this connection point is used as an output terminal of a 180° output signal. In this way, it is possible to generate a signal having a phase difference of 90° in a very wide band.

FIG. 10 shows the example, where the polyphase filter is composed to the RC filers of three stages. However, the invention is not limited to this example, and the number of stages of RC filers constituting the polyphase filter can be optionally set to n (n≧2).

In the above-described first to fourth embodiments, consumption of current in the polyphase filter and the load circuit amounts to only one differential amplifier for one phase, and the number of buffer circuits can be reduced compared with the conventional broadband phase shifter of FIG. 1. Thus, especially in the case of a phase shifter having a large number of cascade-connected stages of RC filters, consumption of power can be greatly reduced. Moreover, in the second and third embodiments, in addition to the advantage of a reduction in the number of buffer circuits, two or more double balanced mixers conventionally provided outside the phase shifter can be installed inside the phase shifter as loads to be shared. As a result, it is possible to further reduce the consumption of power.

As described above, the phase shifter of the invention is constructed in such a manner that the driving section includes the voltage-to-current conversion circuit for converting a voltage value of a input signal into a current value, and outputting an input current signal, the polyphase filter outputs a polyphase phase-shifted current signal as a corresponding polyphase phase-shifted signal according to supplying of the input current signal, the load circuit includes the polyphase current-to-voltage conversion circuit for converting a current value of the polyphase phase-shifted current signal into a voltage value, and outputting a corresponding output signal, and the polyphase filter is driven by a current. The invention is advantageous in that since the number of buffer circuits conventionally needed to prevent attenuation of a signal can be reduced, consumption of power can be reduced. Furthermore, in the second and third embodiments, since other circuit block functions such as double balanced mixers can be installed in the phase shifter, a circuit can be simplified, achieving a further reduction in the consumption of power.

What is claimed is:

1. A phase shifter comprising:
a voltage-to-current conversion circuit for receiving an input signal, converting a voltage value of said input signal into a current value, and outputting an input current signal;
an RC polyphase filter composed of a plurality of cascade-connected stages of RC filters for receiving said input current signal, and outputting a polyphase phase-shifted current signal, each RC filter having resistive and capacitive elements connected alternately cyclically, one end of each resistive element being set as an input terminal, and the other end of each resistive element being set as an output terminal; and
a load circuit including a current-to-voltage conversion circuit for converting each current value of said polyphase phase-shifted current signal into a voltage value, and outputting an output signal,
wherein said RC polyphase filter is constructed by cascade-connecting n stages (n≧2) of RC filters, each RC filter including a first resistor having one end connected to a first input terminal, and the other end connected to a first output terminal, a second resistor having one end connected to a second input terminal, and the other end connected to a second output terminal, a third resistor having one end connected to a third input terminal, and the other end connected to a third output terminal, a fourth resistor having one end connected to a fourth input terminal, and the other end connected to a fourth output terminal, a first capacitor having one end connected to the other end of said first resistor, and the other end connected to one end of said second resistor, a second capacitor having one end connected to the other end of said second resistor, and the other end connected to one end of said third resistor, a third capacitor having one end connected to the other end of said third resistor, and the other end connected to one end of said fourth resistor, and a fourth capacitor having one end connected to the other end of said fourth resistor, and the other end connected to one end of said first resistor, said first and second input terminals of the RC filter of the first stage in an input side are connected in common to enter one input current signal, said third and fourth input terminals are connected in common to enter the other input current signal, and first to fourth phase-shifted output current signals are outputted from said first to fourth output terminals of the RC filter of the n-th stage in an output side.

2. A phase shifter according to claim 1, wherein said load circuit includes first to fourth transistors having emitters respectively connected to said first to fourth output terminals of said RC polyphase filter, bases connected in common to a bias power source, and operated as current-to-voltage conversion circuits each for converting an input current value of said polyphase phase-shifted current signal into a voltage value, first to fourth load resistive elements having ends connected to collectors of said first to fourth transistors, and the other ends connected to a power source, a connection point between said first resistive element and the collector of said first transistor is set as an output terminal of an output signal of 0°, a connection point between said second resistive element and the collector of said second transistor is set as an output terminal of an output signal of 90°, a connection point between said third resistive element and the collector of said third transistor is set as an output terminal of an output signal of 180°, and a connection point between said fourth resistive element and the collector of said fourth transistor is set as an output terminal of an output signal of 270°.

3. A phase shifter according to claim 1, wherein said load circuit includes first and second transistors having emitters connected in common to said first output terminal of said RC polyphase filter, and constituting a first differential circuit, third and fourth transistors having emitters connected in common to said second output terminal of said RC polyphase filter, and constituting a second differential circuit, fifth and sixth transistors having emitters connected in common to said third output terminal of said RC polyphase filter, and constituting a third differential circuit, seventh and eighth transistors having emitters connected in common to said fourth output terminal of said RC polyphase filter, and constituting a fourth differential circuit, and first to fourth resistive elements having ends connected to a power source, bases of said first, third, fifth and seventh transistors are connected in common to be set as a first local signal input terminal, bases of said second, fourth, sixth and eighth transistors are connected in common to be set as a second local signal input terminal, a balanced local signal is supplied from the outside to said first local signal input terminal, a balanced local signal of opposite sign is supplied to said second local signal input terminal, a connection point, to which the other end of said first resistor and collectors of said first and fifth transistors are connected in common, is set as one output terminal of a in-phase output signal, a connection point, to which the other end of said third resistor and collectors of said second and sixth transistors are connected in common, is set as the other output terminal of said in-phase output signal, a connection point, to which the other end of said second resistor and collectors of said third and seventh transistors are connected in common, is set as one output terminal of an orthogonal-phase output signal, and a connection point, to which the other end of said fourth resistor and collectors of said fourth and eighth transistors are connected in common, is set as the other output terminal of said orthogonal-phase output signal.

4. A phase shifter according to claim 1, wherein said load circuit includes first and second transistors having emitters connected in common to said first output terminal of said RC polyphase filter, and constituting a first differential circuit, third and fourth transistors having emitters connected in common to said second output terminal of said RC polyphase filter, and constituting a second differential circuit, fifth and sixth transistors having emitters connected in common to said third output terminal of said RC polyphase filter, and constituting a third differential circuit, seventh and eighth transistors having emitters connected in common to said fourth output terminal of said RC polyphase filter, and constituting a fourth differential circuit, and first and second resistive elements having ends connected to a power source, bases of said first and sixth transistors are connected in common to be set as a first in-phase local signal input terminal, bases of said second and fifth transistors are connected in common to be set as a second in-phase local signal input terminal, bases of said third and eighth transistors are connected in common to be set as a first orthogonal-phase local signal input terminal, bases of said fourth and seventh transistors are connected in common to be set as a second orthogonal-phase local signal input terminal, a balanced in-phase local signal is supplied from the outside to said first in-phase local signal input terminal, a balanced in-phase local signal of opposite sign is supplied to said second in-phase local signal input terminal, a balanced orthogonal-phase local signal is supplied from the outside to said first orthogonal-phase local signal input terminal, a balanced orthogonal-phase local signal of opposite sign is supplied to said second orthogonal-phase local signal input terminal, a connection point, to which the other end of said first resistor and collectors of said first, third, fifth and seventh transistors are connected in common, is set as one output terminal of an output signal, and a connection point, to which the other end of said second resistor and collectors of said second, fourth, sixth and eighth transistors are connected in common, is set as the other output terminal of said output signal.

5. A phase shifter according to claim 1, wherein said load circuit includes first and second transistors having emitters connected in common to said first output terminal of said RC polyphase filter, and constituting a first differential circuit, third and fourth transistors having emitters connected in common to said second output terminal of said RC polyphase filter, and constituting a second differential circuit, fifth and sixth transistors having emitters connected in common to said third output terminal of said RC polyphase filter, and constituting a third differential circuit, seventh and eighth transistors having emitters connected in common to said fourth output terminal of said RC polyphase filter, and constituting a fourth differential circuit, and first to fourth resistive elements having ends connected to a power source, bases of said first to eighth transistors are connected in common to a bias power source, a connection point, to which the other end of said first resistive element and collectors of said first and fourth transistors are connected in common, is set as one output terminal of an output signal phase shifted by 0°, a connection point, to which the other end of said second resistive element and collectors of said third and sixth transistors are connected in common, is set as an output terminal of an output signal phase-shifted by 90°, a connection point, to which the other end of said third resistive element and collectors of said fifth and eighth transistors are connected in common, is set as an output terminal of an output signal phase-shifted by 180°, and a connection point, to which the other end of said fourth resistive element and collectors of said second and seventh transistors are connected in common, is set as an output terminal of an output signal phase-shifted by 270°.

* * * * *